(12) United States Patent
Mastellone et al.

(10) Patent No.: US 10,852,336 B2
(45) Date of Patent: Dec. 1, 2020

(54) ISLANDING DETECTION IN AN ELECTRICAL POWER GRID

(71) Applicant: ABB Schweiz AG, Baden (CH)

(72) Inventors: Silvia Mastellone, Nussbaumen (CH); Peter Al-Hokayem, Nussbaumen (CH); Pietro Raboni, Bigarello (IT)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/155,161

(22) Filed: Oct. 9, 2018

(65) Prior Publication Data

US 2019/0049497 A1 Feb. 14, 2019

Related U.S. Application Data

(63) Continuation of application No. PCT/EP2017/058432, filed on Apr. 7, 2017.

(30) Foreign Application Priority Data

Apr. 8, 2016 (EP) .................................... 16164471

(51) Int. Cl.
*G01R 27/16* (2006.01)
*G06F 30/20* (2020.01)
(Continued)

(52) U.S. Cl.
CPC ....... *G01R 27/16* (2013.01); *G01R 19/16547* (2013.01); *G01R 31/42* (2013.01);
(Continued)

(58) Field of Classification Search
CPC .. G01R 27/16; G01R 19/16547; G01R 31/42; H02J 3/381; H02J 3/382; H02J 3/388;
(Continued)

(56) References Cited

U.S. PATENT DOCUMENTS

2014/0152331 A1* 6/2014 Wagoner ................ G01R 27/16
324/705
2015/0025860 A1* 1/2015 Andresen ................ G06F 30/20
703/2

FOREIGN PATENT DOCUMENTS

| DE | 19910288 A1 | 9/2000 |
|---|---|---|
| EP | 2738905 A2 | 6/2014 |
| EP | 2827157 A1 | 1/2015 |

OTHER PUBLICATIONS

European Patent Office, International Search Report & Written Opinion issued in corresponding Application No. PCT/EP2017/058432, dated Jul. 13, 2017, 12 pp.

(Continued)

*Primary Examiner* — Vincent Q Nguyen
*Assistant Examiner* — Trung Nguyen
(74) *Attorney, Agent, or Firm* — Taft Stettinius & Hollister LLP; J. Bruce Schelkopf (57) ABSTRACT

A method for islanding detection in an electrical power grid supplied by an electrical power source. The method includes measuring an output voltage ($V_{pcc}$) and a grid current ($I_g$) at an interconnection point of the power source with the power grid; estimating at least one grid parameter from the output voltage ($V_{pcc}$) and the grid current ($I_g$) based on optimizing a cost function, which minimizes a difference between the measured output voltage ($V_{pcc}$) and an estimated output voltage or a difference between the measured grid current ($I_g$) and an estimated grid current, which estimated output voltage or estimated output current is a function of the measured grid current ($I_g$) or the measured output voltage ($V_{pcc}$) and the least one estimated grid parameter; and detecting an islanding condition by detecting a jump and/or a deviation in the at least one estimated grid parameter.

13 Claims, 5 Drawing Sheets

(51) Int. Cl.
    *H02J 3/38*         (2006.01)
    *G01R 19/165*    (2006.01)
    *G01R 31/42*     (2006.01)

(52) U.S. Cl.
    CPC .............. *G06F 30/20* (2020.01); *H02J 3/381* (2013.01); *H02J 3/382* (2013.01); *H02J 3/388* (2020.01); *H02J 2203/20* (2020.01); *Y02E 60/76* (2013.01); *Y04S 40/22* (2013.01)

(58) Field of Classification Search
    CPC ...... H02J 2203/20; Y02E 60/76; Y04S 40/22; G06F 30/20
    USPC ............... 324/500, 707, 76.11, 89, 508, 510, 324/764.01, 103 R, 771, 511, 523, 527, 324/713, 602; 361/76, 79, 85, 8
    See application file for complete search history.

(56) References Cited

OTHER PUBLICATIONS

European Patent Office, Search Report issued in corresponding Application No. 16164471.1, dated Sep. 28, 2016, 7 pp.

\* cited by examiner

ISLANDING DETECTION IN AN ELECTRICAL POWER GRID

FIELD OF THE INVENTION

The invention relates to the field of protection and security of electrical equipment. In particular, the invention relates to a method, a computer program, a computer-readable medium and a controller for islanding detection in an electrical power grid. Furthermore, the invention relates to a power source with such a controller.

BACKGROUND OF THE INVENTION

In distributed power generation, a plurality of rather small power sources (such as solar cell arrays or wind turbines) is connected with a large scale power grid at a plurality of locations.

When the power grid or a part of it is turned off, islanding refers to a condition of a distributed power source, which continues to feed the turned off power grid with power. For example, islanding may pose a threat to utility workers, who may not realize that a circuit is still live while attempting to work on the line. Therefore, distributed power sources must detect islanding and immediately stop feeding the power grid with power. This is known as anti-islanding.

For example, a grid-tied solar power system is required by law to have a grid-tie inverter with an anti-islanding function, which senses when a power outage occurs and shuts itself off.

A key challenge in designing an anti-islanding protection function is being able to discriminate the grid disconnection event from other events such as grid faults. Furthermore, an anti-islanding protection function has to react fast, for example within two seconds from the grid disconnection event.

DE 199 10 288 A1 shows a system, which is adapted for determining a grid impedance for controlling an inverter of a solar panel.

EP 2 738 905 A2 relates to a system and method for detecting a grid event on an electrical system connected, for example with a photovoltaic array.

EP 2 827 157 A1 relates to a method for estimating grid properties of a power grid coupled to a generator at a point of common coupling.

DESCRIPTION OF THE INVENTION

It is an objective of the invention to provide a reliable and fast island protection method for distributed power sources.

This objective is achieved by the subject-matter of the independent claims. Further exemplary embodiments are evident from the dependent claims and the following description.

An aspect of the invention relates to a method for islanding detection in an electrical power grid supplied by an electrical power source. As already mentioned above "islanding" may relate to a condition, in which the power source supplied the power grid, although the power grid is disconnected, or the part of the power grid interconnected with the power source is disconnected from the rest of the power grid.

The power grid may be a large scale power grid, i.e. a power grid for interconnecting power sources and power loads via large distances (of more than 100 km).

The power source may be a so-called distributed or renewable power source, such as a solar panel system, a wind turbine, or a small scale water turbine. A small distributed power source may have a power output of less than 100 kW. The method also may be applicable for large power sources, which may have a power output of more than 1 MW.

According to an embodiment of the invention, the method comprises: measuring an output voltage and a grid current at an interconnection point of the power source with the power grid. The output voltage may differ from a grid voltage, since the output voltage may be provided by the operation power source. The interconnection point may be the point of common coupling of the power source with the power grid. The interconnection point may be located before or after an electrical filter interconnecting the power source with the power grid. The measured output voltage and the measured grid currents may be signals with sample values acquired over time.

Additionally, the method comprises: estimating the output voltage or the grid current. The output voltage or grid current may not only be measured but also estimated based on the other quantity. The estimated output voltage may be estimated based on the measured grid current. The estimated grid current may be estimated based on the measured output voltage. It has to be noted that the estimated output voltage or the estimated grid current may be estimated during the optimization of a cost function. This cost function may optimize one or more grid parameters and/or the estimated output voltage or estimated grid current may additionally depend on these one or more grid parameters.

Furthermore, the method comprises: estimating at least one grid parameter based on optimizing a cost function, which may minimize a difference between the measured output voltage and the estimated output voltage, wherein the estimated output voltage is a function of the measured grid current and the least one estimated grid parameter. Alternatively, the cost function may minimize a difference between the measured grid current and an estimated grid current, wherein the estimated grid current is a function of the measured output voltage and the at least one estimated grid parameter.

In general, with the method one or more grid parameters may be estimated. The grid parameters may comprise a grid voltage amplitude, a grid voltage phase, a grid resistance, a grid capacitance, and/or a grid inductance and/or a combination thereof. It has to be noted that these parameters need not be real components of the grid but parameters from an equivalent circuit representing the grid. Thus, the grid parameters may be equivalent parameters.

The estimation of the one or more grid parameters may be based on a cost function. The cost function may be a (discrete) integral over a difference between the measured output voltage and an estimated output voltage or over a difference between the measured grid current and an estimated grid current with respect to a specific (future) time horizon. This cost function is minimized in such a way that this difference becomes minimal.

The estimated output voltage may be a function over time, which depends on the measured grid current and the grid parameters. For example, the estimated output voltage may be determined from one or more equations modelling the equivalent circuit of the power grid. These one or more equations may be seen as a model of the grid.

It has to be noted that the solution of the minimization problem may be determined online and/or offline. For example, the discrete integral of the squared difference of the measured and the estimated output voltage may be treated as a least mean square problem, which may be solved, for example, via a normal equation or a gradient descent method. The normal equation or an equation for gradient descent may be determined offline and the resulting calculations (i.e. evaluation of linear equations) may be performed online.

Additionally, the method comprises: detecting an islanding condition by detecting a jump and/or a deviation from a previous average value in the least one estimated grid parameter. For example, the previous average value may be a nominal value for the respective grid parameter.

The islanding condition in the power grid then may be detected by specific characteristic features of the estimated grid parameters. For example, the one or more estimated grid parameters may be determined with a sample rate in the ms range. The form of the resulting one or more curves of the grid parameter over time indicates an islanding condition. When a grid parameter (or its curve respectively) start to deviate from a previous value and/or has a specific jump from one value to another, this indicates an islanding condition. A jump may be a change in the grid parameter that happens within a specific short time interval, which for example may be shorter than 0.1 s. A deviation may be a change in the grid parameter within a time interval that may be longer than the time interval of a jump, for example in a time interval longer than 0.5 s. Before or after a jump, the grid parameter may be substantially constant. When the grid parameter has a deviation, the grid parameter may drift between two values within a specific time interval.

For example, an average value of the grid parameter may be calculated for a previous time interval. When the actual grid parameter has a difference from the previous average value for more than a threshold value (such as 20%), a deviation of the grid parameter may be detected.

In general, with the method one or more parameters may be estimated to identify a grid disconnection event or islanding condition. In the event of an islanding condition, the power source (or its converter and/or inverter) may be disconnected from the power grid.

The one or more parameters may be estimated rather fast, i.e. in a range below 1 or 2 seconds. Furthermore, the islanding condition may be detected rather accurately, for example with more than 95% accuracy.

Additionally, the method may be performed passively, no signal injection into the grid is required. Only measurements of the output voltage and the grid currents may be necessary to perform the method.

There may be several possibilities to detect an islanding condition:

According to an embodiment of the invention, an islanding condition is detected, when the estimated grid resistance jumps to a resistance value differing not more than 20%, for example, not more than 10%, from a maximal grid resistance. Usually, the grid resistance is low, for example may be nearly zero. When the part of the grid interconnected with the power source is disconnected from the rest of the grid, its resistance may become maximal. The grid resistance may be the effective resistance seen at the output of the power source. In the case of a normalized grid voltage and normalized grid current, the maximal grid resistance may be 1.

According to an embodiment of the invention, an islanding condition is detected, when the estimated grid voltage amplitude jumps to a voltage value less than 20%, for example less than 10%, of a previous average value. The grid voltage may be the effective voltage provided by the power grid at the output of the power source. When the part of the grid interconnected with the power source is disconnected from the rest of the grid, the grid voltage may become (nearly) zero.

According to an embodiment of the invention, an islanding condition is detected, when the estimated grid voltage phase deviates more than 20% of an average previous value of the grid voltage phase. When the part of the grid interconnected with the power source is disconnected from the rest of the grid, there is no more an external voltage controlling the phase and/or frequency of the output voltage generated by the power source. Thus, the frequency and/or the phase of the output voltage, which in this case mainly influence the grid voltage, start to drift.

According to an embodiment of the invention, an islanding condition is detected, when the estimated grid inductance deviates more than 20% of an average previous value of the grid inductance. An indication for the drifting frequency and/or phase of the grid voltage also may be the estimated grid inductance. The grid inductance may be the effective inductance seen at the output of the power source. Considered as a complex value, the grid resistance and the grid inductance together may form a grid impedance.

In general, only one or two or more of the grid parameters may be used for detecting an islanding condition. For example, the estimated grid resistance and one of the other grid parameters may be used for islanding detection. A data fusion algorithm may be used to integrate the information from more than two estimated grid parameters to identify an islanding condition.

According to an embodiment of the invention, the method further comprises: detecting a failure condition in the power grid by detecting a jump and/or a deviation in at least one estimated grid parameter, such as the estimated grid voltage amplitude, grid voltage phase, grid resistance, grid capacitance and/or grid inductance. The failure condition in the power grid may be detected by detecting a jump and/or a deviation from a previous average value in at least one first estimated grid parameter and detecting a missing jump and/or missing deviation in at least one second estimated grid parameter. With the method, also an islanding condition may be discriminated and/or distinguished from a fault or failure condition on the power grid. As mentioned below, an islanding condition may be detected based on specific characteristic features of the one or more estimated grid parameters. Every failure condition in the grid may relate to other specific characteristic features, in the one or more estimated grid parameters. For example, a failure condition may be characterised by the grid voltage amplitude dropping to (nearly) zero and the grid resistance staying (nearly) zero or at least below 5% of the maximal possible (normalized) resistance.

In general, the failure condition may be discriminated from the islanding condition based on a missing jump and/or missing deviation in at least one further grid parameter, such as the estimated grid voltage amplitude, grid voltage phase, grid resistance, grid capacitance and/or grid inductance.

Furthermore, in the case of interconnected power sources (which may be connected in parallel via their inverters with the point of common coupling), the method may discriminate between grid disconnection (islanding) and disconnection from only part of the other power sources, as well as other inverters operating as loads in the case of shading. These conditions all may be discriminated from each other based on respective different characteristics (such as jumps and/or deviations) of the one or more grid parameters.

According to an embodiment of the invention, the output voltage and the grid current may be measured with a high sample rate, for example with a sample rate in the microsecond range. With a sample rate smaller than the frequency of the output voltage (and therefore the grid voltage), higher order frequency contributions (harmonics) from the output voltage and the grid current may be sampled and used for the estimation of the grid parameters.

According to an embodiment of the invention, the grid parameters (such as grid voltage amplitude, grid voltage phase, grid resistance, grid capacitance and/or grid inductance) are estimated with a rate in the millisecond range. In such a way, the islanding detection may be performed with the aid of a large number of estimated values within only a few seconds.

According to an embodiment of the invention, the estimated output voltage is determined for a time horizon, wherein the cost function is based on a discrete integral over the difference between the measured output voltage and the estimated output voltage over the time horizon or is based on a discrete integral over the difference between the measured grid voltage and the estimated gird current over the time horizon. For example, this future time horizon may be much longer than a time interval defined by the sample rate. In such a way, a very low estimation error may be achieved. The time horizon may be in an ms range, for example between 0.1 ms to 2 ms.

According to an embodiment of the invention, the output voltage and the output current are multi-phase quantities and a grid parameter, such as a grid voltage amplitude, grid voltage phase, grid resistance, grid capacitance, and/or grid inductance are determined for one, two or all phases of output voltage and the output current. The power source and the power grid may comprise more than one phase. Accordingly, the output voltage and the grid current of every phase may be measured at the point of common coupling.

With multiple phases there are several possibilities to estimate the grid parameters. It may be possible that the grid parameters are estimated for every phase separately (for example with a cost function for every phase), which results in phase dependent grid parameters. These phase dependent grid parameters may be evaluated for each phase separately to detect a phase-specific islanding condition and/or failure condition. It also may be possible that all phase dependent grid parameters, that have been estimated, are used for detecting an islanding condition and/or failure condition.

As a further possibility, the grid parameters may be estimated based on the output voltages and grid currents measured in all phases. In this case, a cost function depending on the measured values and parameters of all phases may be used.

According to an embodiment of the invention, the output voltage and the output currents are three-phase quantities and are Clarke transformed into a two component system before estimation. In the usual case of a three phase system, the three phases of the output voltage and the grid current may be transformed into the x and y fix frame component system. In this system, the grid parameters may be estimated separately for each component (x and y component) or based on all components, for example analogously as described above for two and more phases.

According to an embodiment of the invention, the estimated output voltage is determined based on a grid model of the power grid, the grid model comprising one or more dynamical equations modelling the power grid, which are evaluated for calculating the estimated output voltage. The grid and optionally other circuitry connected to the point of common coupling (such as an output filter) may be described by one or more differential equations (and/or constraint equations) that may be seen as a model of the grid. These one or more equations may be used for determining the output voltage.

According to an embodiment of the invention, the grid model comprises a model of an output filter connected between the power source and the power grid. In general, the grid model may be enlarged to include one or more output filters and/or one or more resonant loads.

According to an embodiment of the invention, the at least one grid parameter, such as a grid voltage amplitude, a grid voltage phase, a grid resistance, grid capacitance and/or a grid inductance, are estimated for different grid models. It may be possible that the one or more grid parameters to be estimated are estimated for different models. This may be performed simultaneously and/or in parallel.

A best fitting grid model may be selected from the different models, which has a lowest estimation error, the estimating error for a grid model being based on the difference between the measured output voltage and the estimated output voltage for that grid model. The estimating error for a grid model also may be based on a difference between the measured grid current and an estimated grid current For example, it may be tested, which grid model fits best with the current structure of the components connected to the grid. This test may be performed during a time, when no island or failure condition in the grid is detected. In general, the estimation error may be the difference between measured and estimated output voltage integrated via the time horizon for the estimation.

It has to be noted that in more complicated grid models, that may comprise models for resonant loads and other elements, additional grid parameters may be estimated. These additional grid parameters also may be used for islanding detection and/or grid fault detection.

Further aspects of the invention relates to a computer program, which, when being executed on a processor, is adapted for performing the method as described in the above and in the following and to a computer-readable medium, in which such a computer program is stored. For example, the computer program may be stored in a memory of a digital controller.

A computer-readable medium may be a floppy disk, a hard disk, an USB (Universal Serial Bus) storage device, a RAM (Random Access Memory), a ROM (Read Only Memory), an EPROM (Erasable Programmable Read Only Memory) or a FLASH memory. A computer-readable medium may also be a data communication network, e.g. the Internet, which allows downloading a program code. In general, the computer-readable medium may be a non-transitory or transitory medium.

A further aspect of the invention relates to a controller for an electrical power source adapted for being connected with the power grid, wherein the controller is adapted for controlling an inverter of the power source and for performing the method as described in the above and in the following. For example, the controller may comprise a processor for performing the method.

The controller may control the inverter to convert a DC voltage, which, for example, may be generated by a solar panel array or may be provided by a DC link, into an AC voltage to be supplied to the power grid. In the event that an island condition is detected by the controller in the grid, the controller may disconnect the inverter from the grid, may stop the operation of the inverter and/or may inform further components of the power source of the islanding condition.

A further aspect of the invention relates to a power source, which comprises an inverter for converting a DC voltage into an AC voltage to be supplied to the power grid and a controller as described above and in the following.

According to an embodiment of the invention, the power source comprises at least two inverters for converting a DC voltage into an AC voltage to be supplied to the power grid and a controller as described above and in the following adapted for controlling the at least two inverters. The islanding and/or failure detection may be performed on system level.

According to an embodiment of the invention, the power source comprises at least two inverters for converting a DC voltage into an AC voltage to be supplied to the power grid and at least two controller as described above and in the following, each of the controllers adapted for controlling one of the inverters independently from the other controllers. Controllers associated to each inverter may perform the islanding and/or failure detection on inverter level. In particular, a controller of an inverter may detect an islanding condition even in the case, when one or more of the other inverters supply the grid with electrical energy.

It has to be understood that features of the method as described in the above and in the following may be features of the computer program, the computer-readable medium, the controller, the power source as described in the above and in the following, and vice versa.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
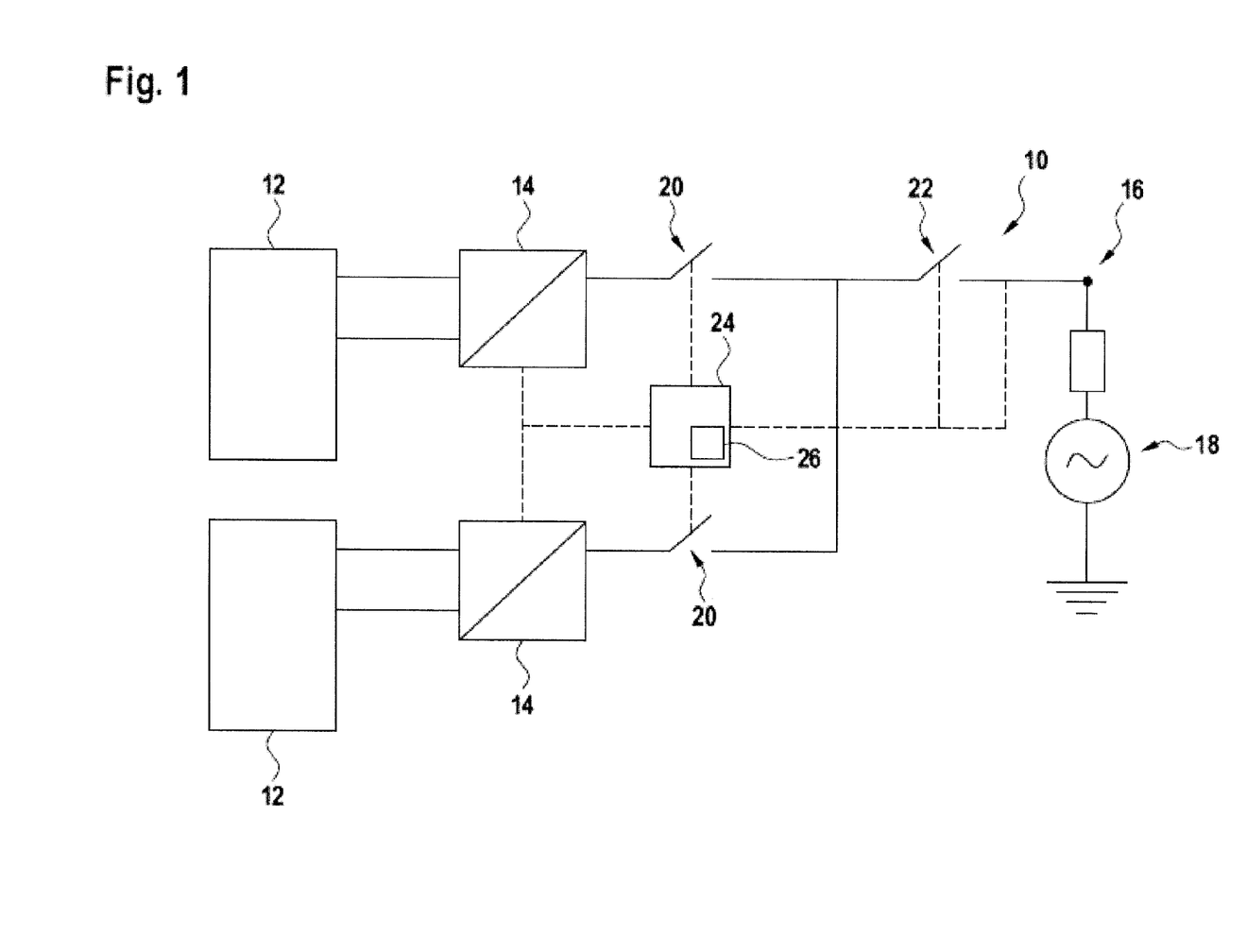
FIG. 1 schematically shows a system with power sources and a controller according to an embodiment of the invention.

FIG. 1 shows an electrical system 10 comprising two power sources 12 (which may by solar power panels or other distributed energy sources). Each of the power sources 12 comprises an inverter 14, which is connected via a point of common coupling 16 (or output 16) with a large scale electrical power grid 18, indicated as AC voltage source in combination with a grid impedance in FIG. 1.

For example, each of the inverters 14 may be adapted for converting a DC voltage from the voltage sources 12 into an AC voltage, which may be a three-phase voltage, to be supplied to the grid 18. Each of the inverters 14 may be disconnected separately from the grid 18 via a switch 20.

Also the system 10 of power sources 12 may be disconnected from the grid 18 via a switch 22.

The system 10 comprises a controller 24, which is adapted to control the inverters 14 and the switches 20, 22. It may be that each of the inverters 14 has a separate controller for controlling the respective inverter 14 and the switch 20. Furthermore, the controller 24 may control the switch 22 for disconnecting the whole system 10 in the case of islanding or a grid fault.

In general, the power source 12 may comprise a controller 24 adapted for controlling the two inverters or the power source 12 may comprise two controllers 24, wherein each of the controllers 24 is adapted for controlling one of the inverters 24 independently from the other controller 24.

The controller 24 (or each of the controllers 24) is adapted for measuring a grid current $I_g$ and an output voltage $V_{pcc}$, at the point of common coupling 16 and for detecting an islanding condition and failure conditions based on these measurements.

In the case of the detection of such a condition, the controller may open the switch 20 and/or the switch 22 to prevent the inverter 14 and/or the power sources 12 to feed the grid 18 with power.

To detect the islanding and failure conditions in the grid 18, the controller 24 comprises an estimator 26 (which may be a submodule of the controller 24 or may be a separate device), which estimates grid parameters based on the measured grid current $I_g$ and measured output voltage $V_{pcc}$.

To achieve this, the estimator 26 uses one or more models of the grid 18, which model a dynamical behaviour of the grid 18 and calculates the grid parameters based on the one or more models. From characteristics of the grid parameters (such as jumps and/or deviations of these grid parameters), the islanding and/or failure conditions are detected.

Figure 2:
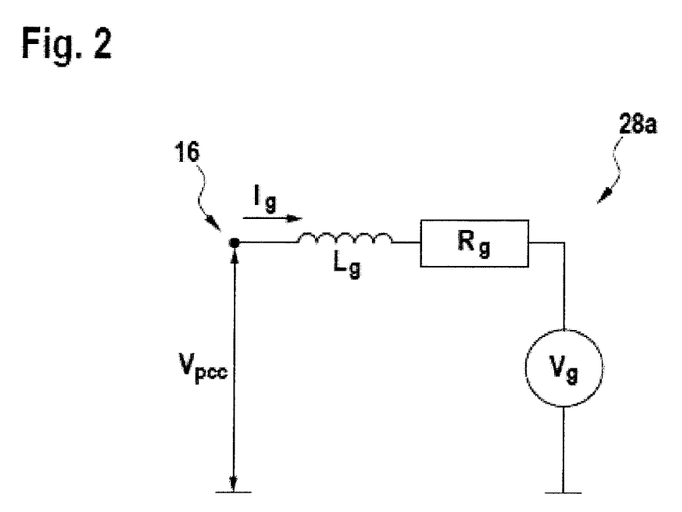
FIG. 2 shows a grid model used in a control method according to an embodiment of the invention.
Figure 3:
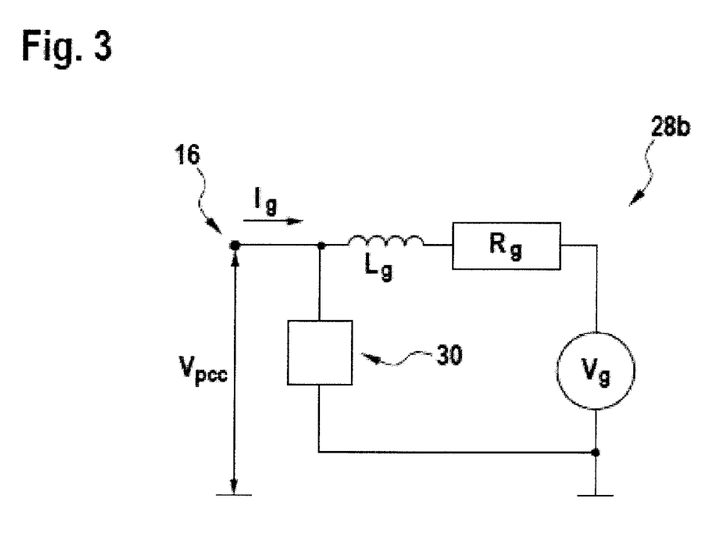
FIG. 3 shows a further grid model used in a control method according to an embodiment of the invention.

FIGS. 2 and 3 show two grid models 28a, 28b, which may be used by the estimator 26.

The grid model 28a comprises a grid inductance $L_g$ and a grid resistance $R_g$, which may be connected in series to a voltage source providing an AC grid voltage $V_g$. In FIG. 2, also the measured output voltage $V_{pcc}$ at the point of common coupling 16 and the AC grid current $I_g$ are shown.

The grid inductance $L_g$, the grid resistance $R_g$, and the grid voltage $V_g$ (or at least the amplitude and the phase of the grid voltage $V_g$) may be seen as grid parameters that may be estimated by the estimator 26 based on the model 28a.

It has to be noted that the grid 18 does not need to have corresponding physical elements, but that the estimator 26 is based or uses dynamical equations that implement the model 26a.

For example, the dynamical equations of the grid model 28a may be given by $$L_g \dot{I}_g = V_g - R_g I_g - V_{pcc}$$

The model 26a may be a single phase model (i.e. a model for only one phase of the grid 18) or a multi-phase model, i.e. a model for all models of the grid 18. The dynamical equation shown above may hold both for a single phase and a multi-phase model 26a.

FIG. 3 shows a more complicated model 28b that comprises the same elements as the model 26a and additionally models a (virtual) component 30 interconnected between the grid 18 and the point of common coupling 16. For example, the component 30 may comprise a load, a resonant load, an output filter, one or more passive elements (such as a resistor, a capacitance or an inductance) and/or a combination thereof.

In standard test procedures used for testing, whether a controller 24 is able to detect an islanding condition in a grid 18, the resonant behaviour of the grid 28 is simulated with a resonant load as shown in FIG. 3 connected to an AC voltage source.

In the following, a method that may be performed by the estimator 26 is described.

The estimator 26 may regularly measure the output voltage $V_{pcc}$ and the grid current $I_g$ at the interconnection point of the power source 12 with the power grid 18, i.e. the point of common coupling 16. For example, the output voltage $V_{pcc}$ and the grid current $I_g$ may be measured with a sample rate in the microsecond range.

When the output voltage $V_{pcc}$ and the grid current $I_g$ are three-phase quantities, they may be Clarke transformed into the x-y component system.

Furthermore, the estimator 26 may regularly estimate grid parameters based on the measured quantities $V_{pcc}$, $I_g$ or their Clarke transformed components. The grid parameters may be estimated with a rate in the millisecond range. In such a way, time dependent grid parameters are produced that may be evaluated in a further step.

Figure 4:
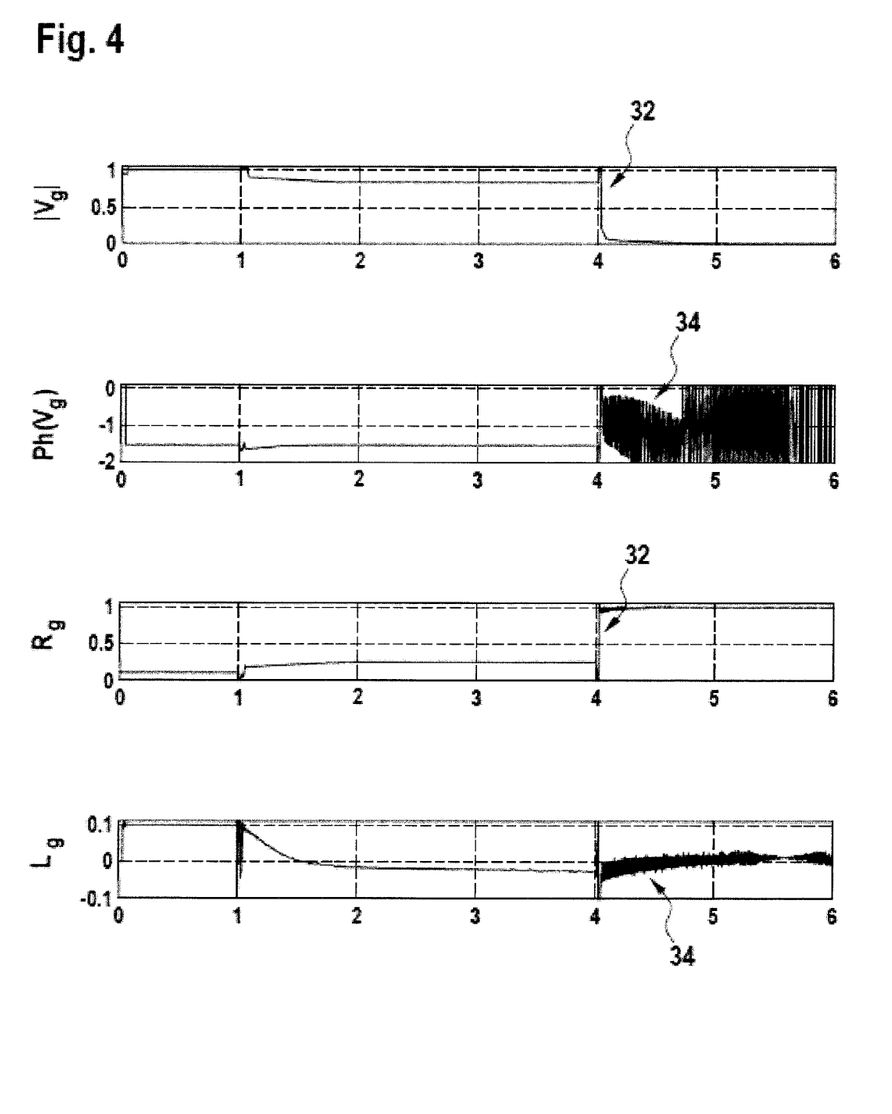
FIG. 4 shows parameters estimated by a control method according to an embodiment of the invention.
Figure 5:
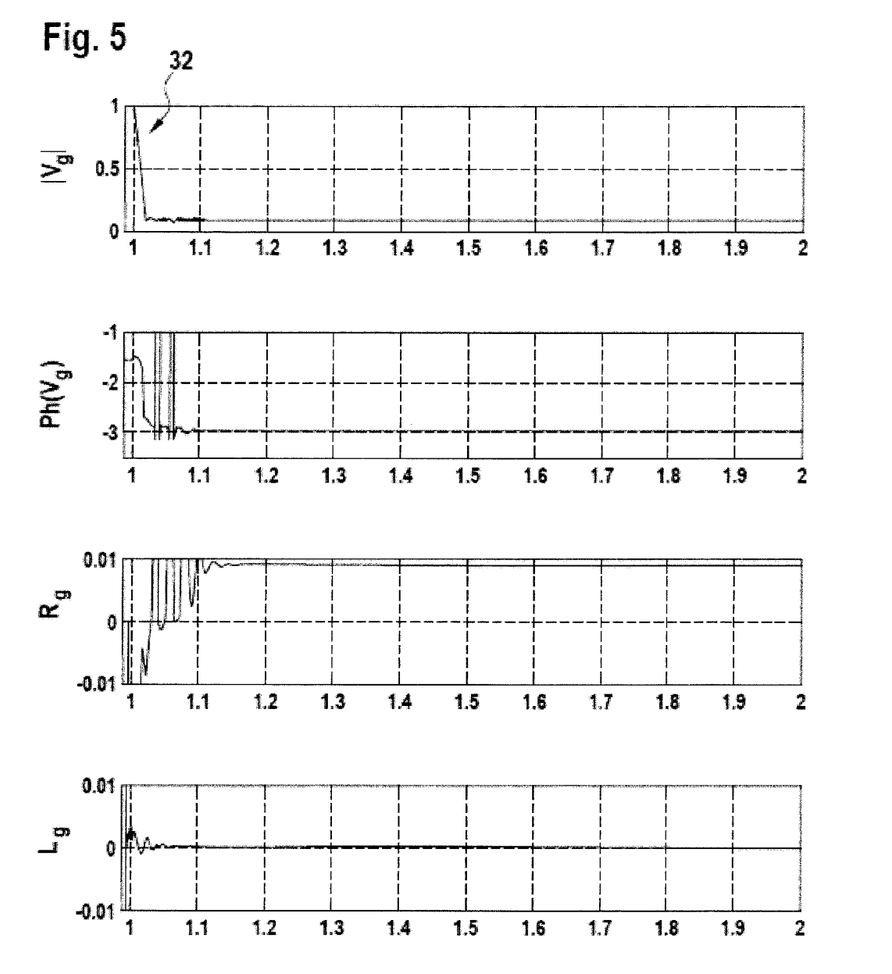
FIG. 5 shows parameters estimated by a control method according to an embodiment of the invention.
Figure 6:
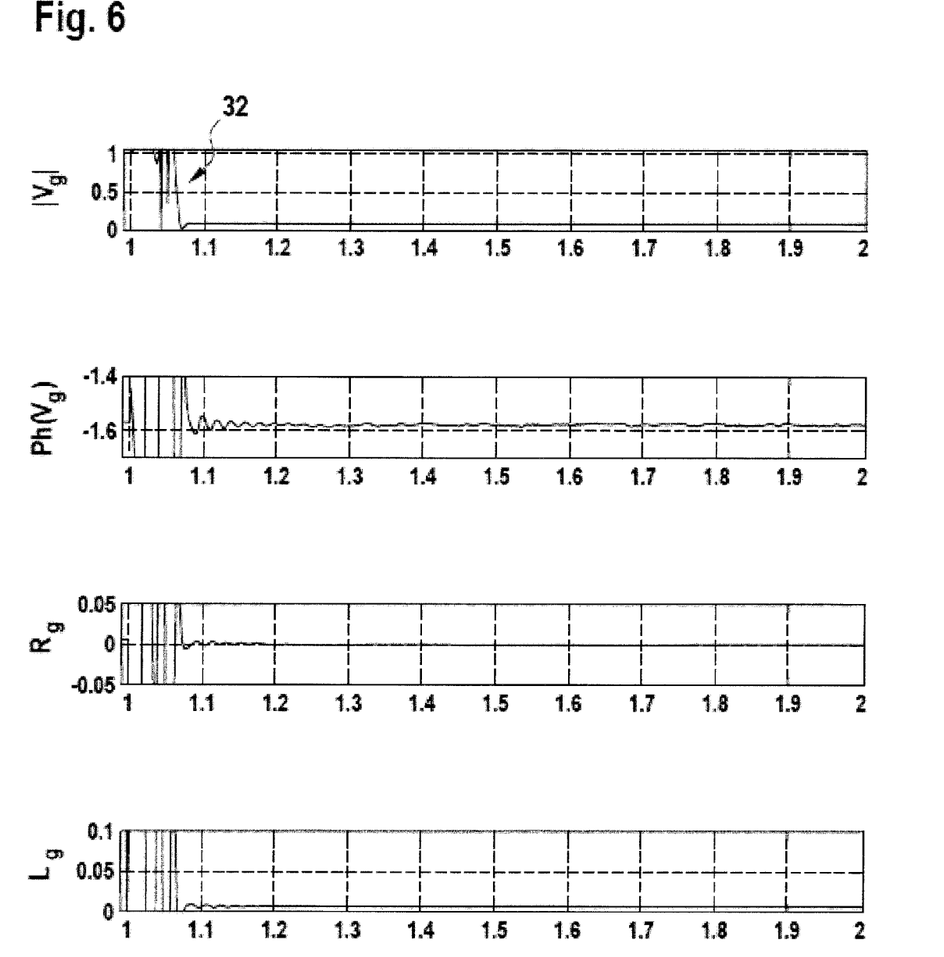
FIG. 6 shows parameters estimated by a control method according to an embodiment of the invention.

FIGS. 4 to 6 show several grid parameters estimated over time, which is shown to the right in seconds.

The grid parameters shown in FIGS. 4 to 6 are the grid voltage amplitude $|V_g|$, the grid voltage phase $Ph(V_g)$, the grid resistance $R_g$ and the grid inductance $L_g$, corresponding to the model 28a shown in FIG. 2. Furthermore, the grid parameters shown in FIG. 3 or other grid parameters, such as one or more additional resonant loads interconnected to the system 10 may be estimated. Other possible parameters to be estimated may be an error or a measure of a deviation between measured currents and/or measured voltages and estimated currents and/or voltages determined by the estimator 26.

The estimator 26 estimates the one or more grid parameters from the output voltage $V_{pcc}$ and the grid current $I_g$ based on optimizing a cost function J, which minimizes a difference between the measured output voltage $V_{pcc}$ and an estimated output voltage $\hat{V}_{pcc}$ or a difference between the measured grid current $I_g$ and an estimated grid current.

The corresponding optimization problem may be described by the cost function J based on the measured output voltage $V_{pcc}$ and the estimated output voltage $\hat{V}_{pcc}$ (at the point of common coupling 16).

$$J = \int \|V_{pcc}(\tau) - \hat{V}_{pcc}(\tau, kT_s)\| dt$$

Optionally subject to further system dynamics which may be encoded into further constraint equations. In the case of a cost function based on a difference between the measured grid current $I_g$ and an estimated grid current, the corresponding quantities may be replaced in the above equation.

With respect to the model 28a, the estimated output voltage $\hat{V}_{pcc}$ (or the estimated grid current) may be a function of the measured grid current $I_g$ (or the measured output voltage $V_{pcc}$) and at least one of the grid voltage amplitude $|V_g|$, grid voltage phase $Ph(V_g)$, grid resistance $R_g$ and grid inductance $L_g$. As already mentioned, additional dynamics also may be included into the estimated output voltage $\hat{V}_{pcc}$ to account for resonant loads, LC, LCL filters and more complex dynamics.

The estimated output voltage $\hat{V}_{pcc}$ (or the estimated grid current) is determined for a time horizon. The cost function J may be a quadratic cost function to be minimized and/or may be based on a discrete integral over the difference between the measured output voltage $V_{pcc}$ and the estimated output voltage $\hat{V}_{pcc}$ over the time horizon. Alternatively, the cost function may be based on a discrete integral over the difference between the measured grid current $I_g$ and an estimated grid current over the time horizon.

This optimization problem may be solved online or offline for determining the grid parameters, which may be the parameters, which based on the current measurements minimize the cost function J. For example, an offline solution may be determined by determining an analytic solution of the optimization problem. The estimator 24 than only has to input the measured values into the analytic solution and to calculate the grid parameters therefrom.

When the output voltage $V_{pcc}$ and the grid current $I_g$ are multi-phase quantities, the grid parameters may be determined for one, two or all phases of output voltage and the grid current $I_g$ separately or one cost function relating to all phases may be minimized.

It also may be possible that the grid parameters are estimated for different grid models 28a, 28b (for example simultaneously in parallel processes). Then, a best fitting grid model 28a, 28b may be selected by the estimator 26, which best fitting model has a lowest estimation error, which is the difference between the measured output voltage $V_{pcc}$ and the estimated output voltage $\hat{V}_{pcc}$ (or the difference between the measured grid current and the estimated grid current) for that grid model 28a, 28b.

In such a way, the estimator 26 may determine the grid model 28a, 28b, which in the best way (i.e. with the smallest error) models the real existing electrical system connected to the point of common coupling 16 on the grid side. This system may be changed, for example due to disconnection or connection of loads and other power source. The estimator 26 then may dynamically update the model 28a, 28b to be used for modelling the grid 18.

For example, in the case, when the controller 24 is only a controller for one of the power sources 12, the estimator 26 also may be able to detect, whether the other power source 12 is connected to the grid. This may be achieved by including the other power source 12 into the model of the estimator 26.

From the grid parameters, the estimator 26 then may detect islanding conditions and/or grid failure conditions.

For example, in FIG. 4 it is shown that at time t=1 s, a (real) resonant load is interconnected between the system 10 and the grid 18 and at time t=4 s, the grid 18 is turned off, i.e. that the system 10 is getting into an islanding condition.

It has to be noted that the estimator 26 in FIG. 4 always estimates based on the model 28a. However, it may be seen from FIG. 4 that even in the case that a resonant load is connected, the normal operation condition up to t=4 s may be discriminated from the islanding condition in FIG. 4 and the failure conditions shown in FIGS. 5 and 6.

As may be seen from FIG. 4, the islanding condition is presented by jumps 32 in the grid parameters and deviations 34 of actual grid parameters from previous grid parameters. A jump 32 may be seen as a very fast deviation 34.

The estimator 26 therefore detects an islanding condition by detecting a jump 32 and/or a deviation 34 in at least one of the estimated grid parameters (being the grid voltage amplitude $|V_g|$, grid voltage phase $Ph(V_g)$, grid resistance $R_g$ and grid inductance $L_g$ in FIG. 4).

For example, an islanding condition may be detected, when the estimated grid voltage amplitude $|V_g|$ jumps from nearly (not more than 20% differing from) the maximal voltage (normalized to 1) to a voltage value differing not more than 20% from 0. Or in other words, an islanding condition may be detected, when the estimated grid voltage amplitude $|V_g|$ jumps to a voltage value less than 20% of a previous average value.

An islanding condition may be detected, when the estimated grid resistance $R_g$ jumps to a resistance value differing not more than 20% from a maximal grid resistance, which here in normalized values is equal to 1.

An islanding condition may be detected, when the estimated grid voltage phase $Ph(V_g)$ starts to drift and deviates from a previous average value of more than 20% and/or by more than a predefined threshold value, which may be 20% of a maximal possible value of the grid voltage phase $Ph(V_g)$.

An islanding condition may be detected, when the estimated grid inductance $L_g$ starts to drift and deviates from a previous average value of more than 20% and/or by more than a predefined threshold value, which may be 20% of a maximal possible value of the grid inductance $L_g$.

The estimator 26 may use one, some or all of the grid parameters to detect the islanding condition. For example, a data fusion algorithm combining the grid parameters may be used to detect the islanding condition.

FIG. 5 shows the behaviour grid parameters during a resistive fault in the grid 18. FIG. 6 is a corresponding drawing showing an inductive fault in the grid 18. In both cases, the fault occurs at t=1 s.

The estimator may detect a failure condition in the power grid 18 by detecting a jump 32 and/or a deviation 34 in at least one of the grid parameters (the grid voltage amplitude $|V_g|$, grid voltage phase $Ph(V_g)$, grid resistance $R_g$ and/or grid inductance $L_g$).

For example, a failure condition may be detected, when the estimated grid voltage amplitude $V_g$) jumps from nearly (not more than 20% differing from) the maximal voltage (normalized to 1) to a voltage value differing not more than 20% from 0.

A resistance failure condition may be detected, when the estimated grid resistance $R_g$ jumps to a different resistance value.

An inductive failure condition may be detected, when the estimated grid inductance $L_g$ jumps to a different inductance value.

The estimator also may be able to discriminate a failure condition from an islanding condition based on a missing jump 32 and/or missing deviation 34 in at least one of the grid parameters (the estimated grid voltage amplitude $|V_g|$, grid voltage phase $Ph(V_g)$, grid resistance $R_g$ and/or grid inductance $L_g$).

For example, when the grid voltage amplitude $|V_g|$ drops and the grid inductance and/or grid resistance has no jumps 32 or at least a jump smaller than a predefined threshold, then the estimator may decide that there is a failure, condition but no islanding condition.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 power source system
12 power source
14 inverter
16 point of common coupling (output)
18 power grid
20 switch
22 switch
24 controller
26 estimator
28a grid model
28b grid model
$V_{pcc}$ output voltage
$I_g$ grid current
$L_g$ grid inductance
$R_g$ grid resistance
$V_g$ grid voltage
$|V_g|$ grid voltage amplitude
$Ph(V_g)$ grid voltage phase
30 component
32 jump
34 deviation

The invention claimed is:

1. A method for islanding detection in an electrical power grid supplied by an electrical power source, the method comprising:
measuring an output voltage ($V_{pcc}$) and a grid current ($I_g$) at an interconnection point of the power source with the power grid;
estimating the output voltage or the grid current;
estimating at least one grid parameter ($|V_g|$, $Ph(V_g)$, $R_g$, $L_g$), based on optimizing a cost function, which minimizes a difference between the measured output voltage ($V_{pcc}$) and the estimated output voltage or a difference between the measured grid current ($I_g$) and the estimated grid current, wherein the estimated output voltage or estimated grid current is a function of the measured grid current ($I_g$) or the measured output voltage ($V_{pcc}$) and the at least one estimated grid parameter;
detecting an islanding condition by detecting a jump and/or a deviation from a previous average value in the least one estimated grid parameter.

2. The method of claim 1,
wherein the at least one grid parameter comprises a voltage amplitude ($|V_g|$), a grid voltage phase ($Ph(V_g)$), a grid resistance ($R_g$), a grid capacitance and/or a grid inductance ($L_g$).

3. The method of claim 2,
wherein an islanding condition is detected, when the estimated grid resistance ($R_g$) jumps to a resistance value differing not more than 20% from a maximal grid resistance; and/or
wherein an islanding condition is detected, when the estimated grid voltage amplitude ($|V_g|$) jumps to a voltage value less than 20% of a previous average value; and/or
wherein an islanding condition is detected, when the estimated grid voltage phase ($Ph(V_g)$) deviates more than 20% of a previous average value of the grid voltage phase; and/or wherein an islanding condition is detected, when the estimated grid inductance ($L_g$) deviates more than 20% of a previous average value of the grid inductance.

4. The method of claim 1,
wherein the output voltage ($V_{pcc}$) and the grid current ($I_g$) are measured with a sample rate in the microsecond range.

5. The method of claim 1,
wherein the at least one grid parameter is estimated with a rate in the millisecond range.

6. The method of claim 1,
wherein the estimated output voltage is determined for a time horizon;
wherein the cost function is based on a discrete integral over the difference between the measured output voltage ($V_{pcc}$) and the estimated output voltage or over the difference between the measured grid current ($I_g$) and an estimated grid current over the time horizon.

7. The method of claim 1,
wherein the output voltage ($V_{pcc}$) and the grid current ($I_g$) are multi-phase quantities and the at least one grid parameter is determined for one, two or all phases of the output voltage ($V_{pcc}$) and the grid current ($I_g$).

8. The method of claim 1,
wherein the output voltage ($V_{pcc}$) and the grid current ($I_g$) are three-phase quantities and are Clarke transformed into a two component system before estimation.

9. The method of claim 1,
wherein the estimated output voltage is determined based on a grid model of the power grid, the grid model comprising one or more dynamical equations modelling the power grid, which are evaluated for calculating the estimated output voltage.

10. The method of claim 9,
wherein the grid model comprises a model of an output filter connected between the power source and the power grid.

11. The method of claim 1,
wherein the at least one grid parameter is estimated for different grid models;
wherein a best fitting grid model is selected, which has a lowest estimation error, the estimating error for a grid model being the difference between the measured output voltage ($V_{pcc}$) and the estimated output voltage or the difference between the measured grid current ($I_g$) and an estimated grid current for that grid model.

12. The method of claim 2,
wherein a failure condition in the power grid is detected by detecting a jump and/or a deviation from a previous average value in at least one first estimated grid parameter and detecting a missing jump and/or missing deviation in at least one second estimated grid parameter.

13. The method of claim 2,
wherein the output voltage ($V_{pcc}$) and the grid current ($I_g$) are measured with a sample rate in the microsecond range.

* * * * *